(12) United States Patent
Wang et al.

(10) Patent No.: US 8,558,329 B2
(45) Date of Patent: Oct. 15, 2013

(54) PIEZO-PHOTOTRONIC SENSOR

(75) Inventors: Zhong L. Wang, Marietta, GA (US); Youfan Hu, Atlanta, GA (US); Yan Zhang, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 454 days.

(21) Appl. No.: 12/945,077

(22) Filed: Nov. 12, 2010

(65) Prior Publication Data

US 2012/0153860 A1 Jun. 21, 2012

Related U.S. Application Data

(60) Provisional application No. 61/261,033, filed on Nov. 13, 2010.

(51) Int. Cl.
*H01L 29/84* (2006.01)

(52) U.S. Cl.
USPC .................................................. 257/415

(58) Field of Classification Search
CPC ...................................................... H01L 29/84
USPC ............... 257/415, 82, 12; 438/466; 977/762
See application file for complete search history.

(56) References Cited

U.S. PATENT DOCUMENTS

| | | | |
|---|---|---|---|
| 4,011,745 A | 3/1977 | Gatos et al. | |
| 6,586,095 B2 | 7/2003 | Wang et al. | |
| 6,999,221 B1 | 2/2006 | Sarkisov et al. | |
| 7,220,310 B2 | 5/2007 | Wang et al. | |
| 7,351,607 B2 | 4/2008 | Wang et al. | |
| 7,426,025 B2 | 9/2008 | Wang et al. | |
| 7,705,523 B2 | 4/2010 | Wang et al. | |
| 7,898,156 B2 | 3/2011 | Wang et al. | |
| 2003/0205657 A1 | 11/2003 | Voisin | |
| 2004/0127025 A1 | 7/2004 | Crocker, Jr. et al. | |
| 2005/0188751 A1 | 9/2005 | Puskas | |
| 2005/0242366 A1 | 11/2005 | Parikh et al. | |
| 2008/0067618 A1 | 3/2008 | Wang et al. | |
| 2009/0066195 A1 | 3/2009 | Wang et al. | |
| 2009/0115293 A1 | 5/2009 | Wang et al. | |

(Continued)

OTHER PUBLICATIONS

Jun Zhou et al., Flexible Piezotronic Strain Sensor, Aug. 16, 2008, American Chemical Society, Nano Lett., vol. 8, No. 9, 2008, pp. 3035-3040.*

(Continued)

*Primary Examiner* — Stephen W Smoot
*Assistant Examiner* — Pavel Ivanov
(74) *Attorney, Agent, or Firm* — Bryan W. Bockhop; Bockhop & Associates, LLC

(57) ABSTRACT

A device includes a substrate having a first surface. A piezoelectric nanowire is disposed on the first surface of the substrate. The piezoelectric nanowire has a first end and an opposite second end. The piezoelectric nanowire is subjected to an amount of strain. A first Schottky contact is in electrical communication with the first end of the piezoelectric nanowire. A second Schottky contact is in electrical communication with the second end of the piezoelectric nanowire. A bias voltage source is configured to impart a bias voltage between the first Schottky contact and the second Schottky contact. A mechanism is configured to measure current flowing through the piezoelectric nanowire. The amount of strain is selected so that a predetermined current will flow through the piezoelectric nanowire when light of a selected intensity is applied to a first location on the piezoelectric nanowire.

6 Claims, 3 Drawing Sheets

(56) References Cited

U.S. PATENT DOCUMENTS

| | | |
|---|---|---|
| 2009/0179523 A1 | 7/2009 | Wang et al. |
| 2009/0209303 A1 | 8/2009 | Kroll et al. |
| 2010/0026142 A1 | 2/2010 | Jones et al. |
| 2010/0117488 A1 | 5/2010 | Wang et al. |
| 2010/0147371 A1 | 6/2010 | Cho |
| 2010/0191153 A1 | 7/2010 | Sanders et al. |

OTHER PUBLICATIONS

Rusen. S. Yang, Y. Qin, L.M. Dai, Z.L. Wang; Power generation with laterally packaged piezoelectric fine wires; Nov. 8, 2008; Nature Publishing Group; Nat. Nanotechnol. 4 (2009), pp. 34-39.*

Y.W. Heo et al, ZnO nanowire growth and devices, Elsevier, Materials Science and Engineering R 47 (2004) 1-47.*

Jeon et al., "MEMS power generator with transverse mode thin film PCT," Science Direct, vol. 122, Issue 1, Jul. 29, 2005, pp. 16-22.

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

* cited by examiner

PIEZO-PHOTOTRONIC SENSOR

CROSS-REFERENCE TO RELATED APPLICATION(S)

This application claims the benefit of U.S. Provisional Patent Application Ser. No. 61/261,033, filed Nov. 13, 2009, the entirety of which is hereby incorporated herein by reference.

STATEMENT OF GOVERNMENT INTEREST

This invention was made with government support under contract No. DE-FG02-07ER46394, awarded by the Department of Energy and under contract No. W31P4Q-08-1-0009, awarded by the United States Army. The government has certain rights in the invention.

BACKGROUND OF THE INVENTION

1. Field of the Invention

The present invention relates to photonic devices and, more specifically, to photonic devices employing piezoelectronic materials.

2. Description of the Related Art

Semiconductor nanowires are the fundamental materials for fabricating a wide range of nanodevices. In the oxide family, ZnO nanowires and nanobelts have been widely studied as a key ID oxide nano-material for numerous applications. Due to the piezoelectric and semiconducting coupled properties, a range of nanodevices of ZnO have been developed, such as nano-generators, piezoelectric field effect transistors, piezoelectric diode, and strain sensors. ZnO exhibits a direct band gap of 3.4 eV and a large exciton binding energy (60 meV) at room temperature make ZnO.

SUMMARY OF THE INVENTION

The disadvantages of the prior art are overcome by the present invention which, in one aspect, is a device that includes a substrate having a first surface. A piezoelectric nanowire is disposed on the first surface of the substrate. The piezoelectric nanowire has a first end and an opposite second end. The piezoelectric nanowire is subjected to an amount of strain. A first Schottky contact is in electrical communication with the first end of the piezoelectric nanowire. A second Schottky contact is in electrical communication with the second end of the piezoelectric nanowire. A bias voltage source is configured to impart a bias voltage between the first Schottky contact and the second Schottky contact. A mechanism is configured to measure current flowing through the piezoelectric nanowire. The amount of strain is selected so that a predetermined current will flow through the piezoelectric nanowire when light of a selected intensity is applied to a first location on the piezoelectric nanowire.

In another aspect, the invention is a method of detecting intensity of a light beam in which a predetermined amount of strain is applied to a light detecting device that includes a piezoelectric nanowire and two spaced apart Schottky contacts in electrical communication therewith. A bias voltage is applied between the two spaced apart Schottky contacts. A portion of the light detecting device is subjected to the light beam. A current flowing through the piezoelectric nanowire measured, thereby measuring the intensity of the light beam.

In another aspect, the invention is a method of maximizing power output of a photon cell in which a predetermined amount of strain is applied to a structure of photon cell that includes a piezoelectric nanowire and two spaced apart Schottky and Ohmic contacts in electrical communication therewith. A portion of the device is subjected to a light beam.

In yet another aspect, the invention is a method of maximizing the efficiency of a light emitting diode that includes a first semiconductor materials and an adjacent second piezoelectric semiconductor material. A predetermined amount of strain is applied to the second piezoelectric semiconductor material. A voltage is applied across the light emitting diode, thereby generating light.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
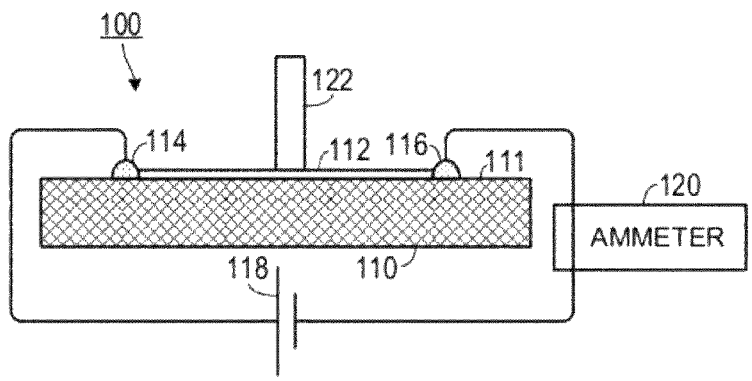
FIG. 1 is a schematic diagram of a first embodiment of a piezo-phototronic device.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." "Nanowires" include nano-scale wires and micro-scale wires.

The following U.S. patent applications disclose methods of generating zinc oxide piezoelectric nanostructures, including nanowires, of the types disclosed below and are hereby incorporated by reference: Ser. Nos. 10/726,016, filed on Dec. 2, 2003 by Wang et al., 11/608,865, filed on Dec. 11, 2006 by Wang et al., 11/760,002, filed on Jun. 8, 2007 by Wang et al., 12/209,310, filed on Sep. 12, 2008 by Wang et al., and 12/413, 470, filed on Mar. 27, 2009 by Wang et al. U.S. Pat. No. 6,586,095 issued on Jul. 1, 2003 to Wang et al. also discloses methods of generating piezoelectric nanostructures and is hereby incorporated by reference.

As shown in FIG. 1, one embodiment of a piezo-phototronic device 100 includes a flexible substrate 110 (which, in one embodiment includes a polymer, such as polystyrene) having a first surface 111 onto which is disposed a piezoelectric nanowire 112. The piezoelectric nanowire 112 (such as a zinc oxide nanowire) having a first end in electrical communication with a first Schottky contact 114 (such as a metal contact) and an opposite second end in electrical communication with a second Schottky contact 116 (which can also be a metal contact). The piezoelectric nanowire 112 is subjected to an amount of strain (which in one embodiment is in a range of 2% tensile strain to −2% compressive strain). A bias voltage source 118 imparts a bias voltage between the first Schottky contact 114 and the second Schottky contact 116. A mechanism 120 (such as an ammeter) measures current flowing through the piezoelectric nanowire 112. The amount of strain is selected so that a predetermined current will through the piezoelectric nanowire 112 when light 122 of a selected intensity is applied to a first location on the piezoelectric nanowire.

Figure 2A:
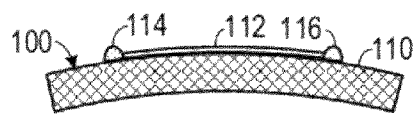
FIGS. 2A-2B are schematic diagrams of piezo-phototronic devices being subjected to strain.
Figure 2B:
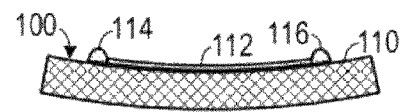

As shown in FIGS. 2A and 2B, typically, the thickness of the substrate 110 is substantially greater than the diameter of the nanowire 112. This allows for the application of strain by simply bending the substrate 110 and the nanowire 112. FIG. 2A shows tensile strain being applied by bending the center of the device 100 upwardly, whereas FIG. 2B shows compressive strain being applied by bending the center of the device 100 downwardly.

To detect the intensity of a light beam 122 a predetermined amount of strain is applied to the piezo-phototronic device 100 and current flowing through the nanowire 112 is measured by the ammeter 120. The amount of current corresponds to the intensity of the light beam 122. This type of device may also be used to measure strain when the intensity of the light beam 122 is known, as the amount of current also corresponds to the amount of strain applied.

In one experimental embodiment, the ZnO microwires were grown by a high-temperature thermal evaporation process. The typical diameter was around 2-6 μm, and the length was several hundred micrometers to several millimeters. Such long microwires were chosen for easy manipulation using a mechanical deformation stage and with consideration of the limited size of the laser spot, but the same principle applies to nanowires. For device fabrication, a ZnO microwire was first laid down on a polystyrene (PS) substrate, and then each end of the wire was fixed to the substrate using silver paste; metal wires were also bonded to a ZnO microwire for electrical measurement. The dimension of the PS substrate was 3.5 mm in length, 5 mm in width and with a thickness of 1 mm. An additional layer of polydimethylsiloxane (PDMS) was used to package the device, and it kept the device mechanically robust under repeated manipulation. The thickness of the PDMS layer was much thinner than the thickness of the PS substrate. A He—Cd laser (with wavelength=325 nm) was used as the source for photo-excitation. The diameter of the beam was focused to a spot less than ~20 μm. A Keithley 4200 Semiconductor Characterization System was used to carry out electrical measurements.

Figures 3A, 3B, 3C:
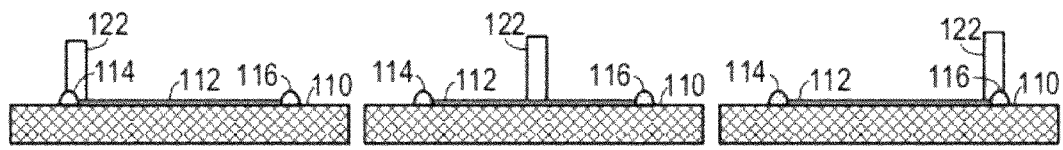
FIGS. 3A-3C are schematic diagrams of piezo-phototronic devices with a light beam being applied to different positions.
Figure 4A:
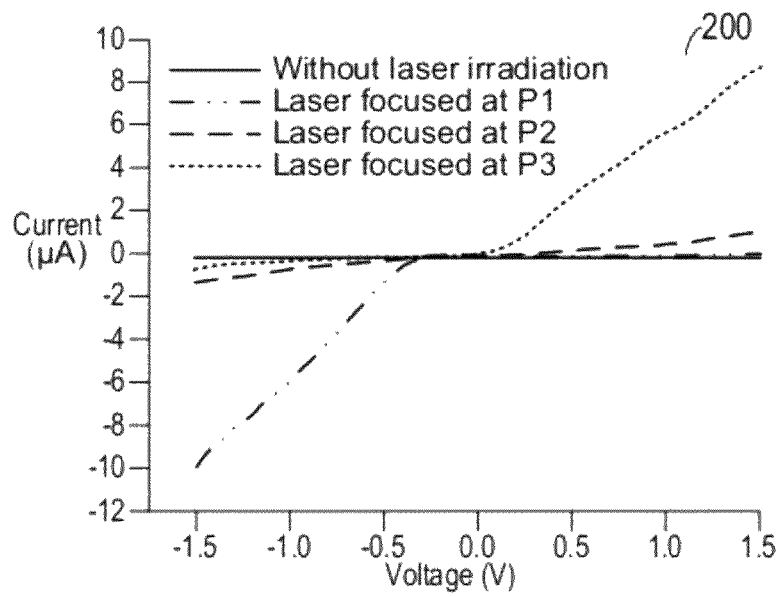
FIG. 4A is a set of I-V curves recorded at corresponding laser focused positions on an embodiment of the device.
Figure 4B:
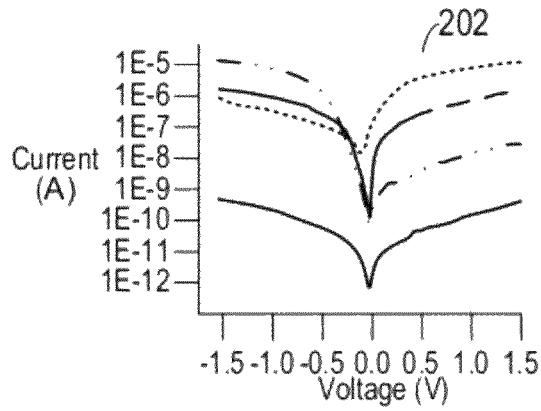
FIG. 4B is a logarithm plot of the absolute value of the current for the I-V curves.
Figure 5:
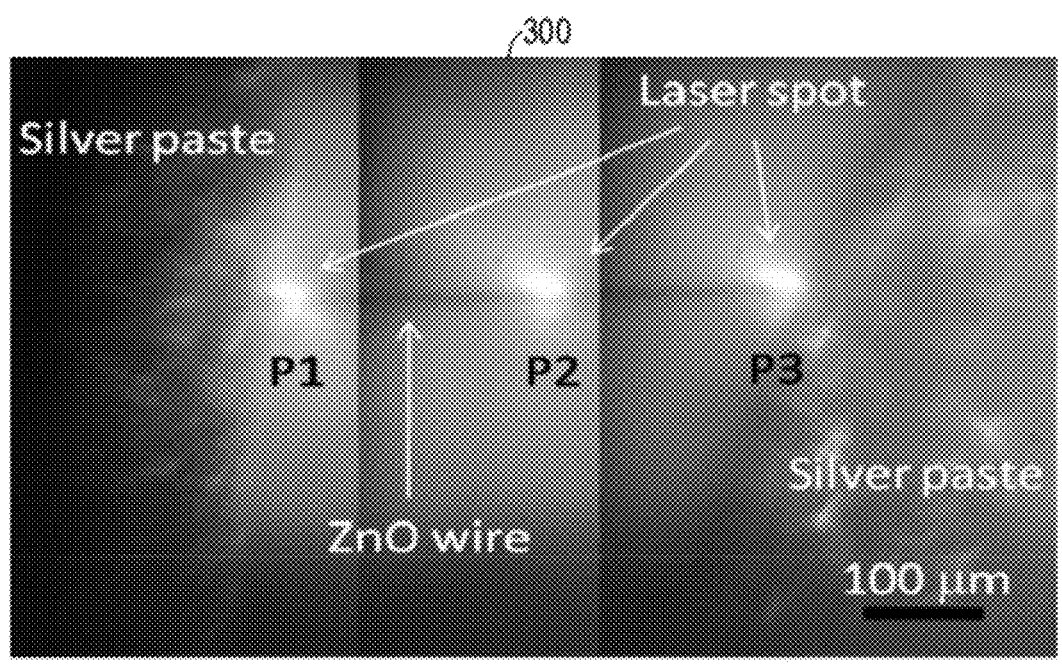
FIG. 5 is a micrograph of a piezo-phototronic device.

The photo-response of a microwire device with photo-excitation at different locations along the ZnO microwire was measured. FIG. 3A shows the beam being directed to position P1, FIG. 3B shows the laser beam being directed to position P2 and FIG. 3C shows the beam being directed to position P3. (These positions are also shown in the micrograph of the experimental system 300 shown in FIG. 5) Points P1, P2 and P3 respectively represent the positions at the left-hand metal-ZnO contact, central channel region and right-hand metal-ZnO contact. FIG. 4A shows the I-V curves 200 recorded with the laser spot at the corresponding positions and FIG. 4B shows a logarithm plot 202 of the current as a function of the applied voltage showing the change in the magnitude of the current. Originally, the I-V characteristic without laser irradiation is symmetrically non-linear, which indicates that Schottky barriers (SBs) were formed at the two contacts with similar barrier heights. When the laser was focused at the left-hand or right-hand metal-ZnO contact (positions P1 and P2, respectively), there was a much greater photo-response when the SB was reversely biased than when it was forward biased. The relative change in the photon-conductance reached as much as 3 orders of magnitudes for the local SB when it was reversely biased instead of forward biased, and a very non-symmetrical I-V characteristic was observed. However, when the laser was focused at the channel center, position P2 (e.g. the microwire only, far from each metal-ZnO contact) a symmetric I-V characteristic was seen, and the photo-response was moderate compared to the reverse biased SB case. The shape of the I-V curve in this case is similar to that of the as-fabricated device without laser excitation except for the increase in magnitude, as shown in FIG. 4B.

Figure 4C:
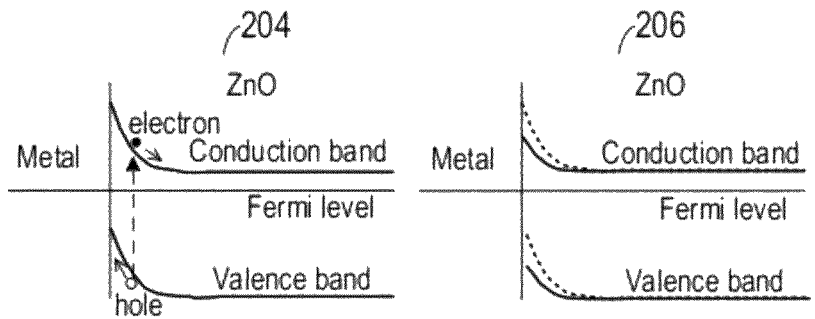
FIG. 4C includes a pair of schematic band diagrams of a metal-ZnO SB contact under laser excitation.

The result presented in FIGS. 4A and 4B can be understood from the mechanism of photo-excitation at a SB. When a SB is formed at the metal-ZnO interface, negative charges build up at the metal surface in a very thin layer. An equal amount of positive charge must exist in the ZnO depletion region. Thus, a strong local electric field is formed in the depletion region. Under the irradiation of a light source with energy greater than the band gap, electrons in ZnO's valence band will be excited into the conduction band, leaving holes in the valence band. These photon generated carriers will contribute to the current only when they can drift or diffuse into the electrode before recombination occurs. If the laser irradiation occurs at the depletion region or at a location less than a diffusion length away from it, the photon generated electrons and holes are quickly swept away from this area in opposite directions by the strong local electric field in the region, as indicated in the left part 204 of 4C. Therefore, the recombination rate in this area will be greatly depressed, and the local conductance is greatly enhanced. Moreover, the migration of holes into the metal side and the generated electrons in the depletion layer will reduce the local net charge density in the region, thus, the local electric field is lowered, resulting in a reduced height of the SB, as shown at the right-hand part 206 of FIG. 4C. When the SB is reversely biased, the applied electric field is in parallel to the local electric field in the depletion region, resulting in a large enhancement in the photoconductivity. This is also the working principle of photodiodes.

In the case of a forward biased SB, two scenarios have to be considered. One, when the applied voltage is low, the applied electric field is opposed to the local electric field and not much change in the local conductance is expected. The second, when the applied voltage is high enough, there is no barrier seen by the electrons, and thus no strong local electric field to effectively separate the photon generated electrons and holes. Thus, they have limited contribution to the conductance. Therefore, as a whole, the photo-response of the forward biased SB has a much smaller effect than in the reverse biased case in tuning the local electric transport property.

When the excitation is focused at the central channel of the wire far from the two end contacts, there is only an effect of photon induced generation of electrons and holes. But the recombination rate is much higher in this region than in the reverse biased SB area. So the photo-response is much smaller here comparing to the reverse biased SB case. It must be noted that, if the original carrier density is very high, the photon generated carriers will have limited influence on the conductance.

In one experimental embodiment, the inventors measured the original I-V characteristics of the device in the dark condition. Various I-V characteristics were found in the experiments. The symmetric rectifying I-V curves indicated that there were two back-to-back Schottky contacts at the two ends of the ZnO wire. As for the UV responsivity measurements, the bias was set at a fixed value of −5 V (reverse bias) for all of the measurements unless specifically indicated. The measured absolute current increased significantly with light illumination: the dark current was about 14 pA, the current increased to 260 nA under 22 μW/cm² light illumination, further increased to 1.9 μA under 33 mW/cm² light illumination. The sensitivity defined as $(I_{light}-I_{dark})/I_{dark}$ was found to be $1.8\times10^6$% and $1.4\times10^7$% at 22 μW/cm² and 33 mW/cm² illumination, respectively. The sensitivity here is one or two orders of magnitude higher than that in a single Schottky contact device, because of the very low dark current due to the depletion layer formed at the two Schottky contacts and oxygen-related hole trapping states at the ZnO wire surface. Spectral photo-response of a ZnO wire photodetector showed a large UV-to-visible rejection ratio, which is defined as the sensitivity measured at UV divided by that at blue, and it was about $10^4$ for the photodetector. The high spectral selectivity combined with high sensitivity suggests the possibility of using the ZnO wire photodetector as 'visible-blind' UV photodetector for environmental, space-based, defense and industrial applications. The photodetector was also measured with light on and off for many cycles with different light intensities, showing an excellent reversibility and stability with decay time about 1 s. The relative long reset time may be caused by the ultra-long length of the wire which is used for easy and precise controlling the strain in the wire.

The photocurrent ($I_{ph}=|I_{light}-I_{dark}|$) increased linearly with the optical power and showed no saturation at high power levels, offering a large dynamic range from sub-μW/cm² to mW/cm². The total responsivity of the photodetector, $\mathcal{R}$, is defined as $$\mathcal{R} = \frac{I_{ph}}{P_{ill}} = \frac{\eta_{ext}q}{h\nu}\cdot\Gamma_G \quad (1)$$

$$P_{ill} = I_{ill}\times d\times l \quad (2)$$

where $\mathcal{R}$, is the responsivity, $I_{ph}$ photocurrent, $P_{ill}$ the illumination power on the photodetector, $\eta_{ext}$ the external quantum efficiency, q the electronic charge, h Planck's constant, ν the frequency of the light, $\Gamma_G$ the internal gain, $I_{ill}$ the excitation power, d the diameter of the ZnO wire, l is the spacing between two electrodes. Remarkably, the calculated responsivity of the device is super high, approximately $4.5\times10^4$ A W$^{-1}$ at an intensity of 0.75 μW/cm² of UV light illumination. The internal gain can be estimated to be $1.5\times10^5$ by assuming $\eta_{ext}=1$ for simplicity. The high internal gain and high responsivity is attributed to the oxygen-related hole trapping states[14] and the shrinking of the Schottky barrier upon illumination. The decrease of the responsivity at relative high light intensities is due to hole-trapping saturation and Schottky barrier transparent at large light intensity.

The structure illustrates the effects of the piezo-potential on the performance of the photodetector. First, the inventors investigated the effects of piezo-potential on the dark current of the photodetector. Without strain, the dark current versus voltage curve of the device in semi-logarithmic scale was very flat, even out to high bias, remained <50 pA at a reverse bias of −20 V. No evidence of breakdown due to the low level defects in the ZnO wire and good Schottky contact were observed. I-V curves in the dark remained no change under different tensile and compressive strain, which means that piezo-potential has very small effect on the dark current. Then, the I-V curve was measured under various compressive and tensile strain upon UV illumination. The absolute current at a negative bias increased step-by-step when applied a variable strain from 0.36% tensile to −0.36% compressing. Because the dark current did not change under strain, the sensitivity, responsivity, and detectivity of the photodetector increased under compressive strain. The responsivity of the photodetector under −0.36% compressive strain was enhanced by 530%, 190%, 9% and 15% upon 0.75 μW/cm², 22 μW/cm², 0.75 mW/cm² and 33 mW/cm² illumination, respectively. The corresponding light power illuminated onto the ZnO wire was about 4.1 pW, 120.0 pW, 4.1 nW, 180.4 nW, respectively. The photocurrent is largely enhanced for pW level light detection by using piezoelectric effect and the effect of strain is much larger for weak light detection than for strong light detection.

Some of the devices show opposite change when applying the same strain. The absolute current decreased step-by-step when applied a variable strain from 0.36% tensile to −0.36% compression. Tensile strain improved the responsivity of the photodetector. This phenomenon is attributed to the switching in signs of the piezo-potential, which depends on the orientation of the c axis of the ZnO wire.

The device can be considered as a single ZnO wire sandwiched between two back-to-back Schottky diodes. When a relatively large negative voltage was applied, the voltage drop occurred mainly at the reversely biased Schottky barrier $\phi_d$ at the drain side, which is denoted as $V_d \approx V$. Under reverse bias and in the dark condition, thermionic emission with barrier lowering is usually the dominant current transport mechanism at a Schottky barrier, which can be described by the thermionic-emission-diffusion theory (for V>>3 kT/q~77 mV) as:

$$I_{TED}^{dark} = SA^{**}T^2\exp\left(-\frac{q\phi_d^{dark}}{kT}\right)\times\exp\left[\sqrt[4]{\frac{q^7N_D\left(V+V_{bi}-\frac{kT}{q}\right)}{8\pi^2\varepsilon_s^a}}\middle/kT\right] \quad (3)$$

$$V_{bi} = \phi_d^{dark} - (E_C - E_f) \quad (4)$$

in which S the area of the Schottky contact, $A^{**}$ the effective Richardson constant, T the temperature, q the unit electronic charge, k Bolzmann's constant, $N_D$ the donor impurity density, V the applied voltage, $V_{bi}$ the built-in potential, and $\varepsilon_s$ the permittivity of ZnO.

The effect of photo illumination on semiconductor thermionic emission is to lower the energy barrier by the difference between the quasi-Fermi level with photo-excitation and the Fermi level without photo-excitation and to reduce the width of depletion layer by photon generated holes trapping in the depletion layer. The current transport mechanism with illumination can be describes as:

$$I_{TED}^{ill} = SA^{**}T^2\exp\left(-\frac{q(\phi_d^{dark}-(E_{FN}-E_f))}{kT}\right)\times \exp\left[\sqrt[4]{\frac{q^7N_D\left(V+V_{bi}-\frac{kT}{q}\right)}{8\pi^2\varepsilon_s^3}}\middle/kT\right] \quad (5)$$

$$= SA^{**}T^2 \exp\left(-\frac{q\phi_d^{ill}}{kT}\right) \times \exp\left[\sqrt[4]{\frac{q^7 N_D\left(V + V_{bi} - \frac{kT}{q}\right)}{8\pi^2 \varepsilon_s^3}}\middle/ kT\right]$$

where $E_{FN}$ is quasi Fermi level with illumination.

The ln I-V qualitatively indicates that the variation of ln I can be described by the power law of $V^{1/4}$ for reversely biased Schottky barrier. However, the slope and extended zero voltage point for the fitting data with light illumination is larger than those in the dark. According to equations (4) and (5), the difference may be attributed to an effective lowering of Schottky barrier, and the change of $N_D$ due to the holes trapped in the depletion region.

By assuming S, $A^{**}$, T, $N_D$ are independent of strain at small deformation, the change of Schottky barrier height (SBH) with strain upon illumination can be determined by:

$$\ln\left(\frac{I(\varepsilon_{xx})}{I(0)}\right) = -\frac{\Delta\phi_{kT}^{ill}}{kT} \quad (6)$$

where $I(\varepsilon_{xx})$ and $I(0)$ are the current measured through the ZnO wire at a fixed bias with and without strain applied, respectively. The results indicate that the change of SBH has an approximately linear relationship with strain. Furthermore, the slope of the change of SBH varies with the excitation light intensity. It means that the derived change of barrier height with strain depends on excitation light intensity, the SBH changes faster at low light intensity than that at high light intensity. The change of the total responsivity of the photodetector with strain is similar as the change of current; the difference is that current increases when increasing light intensity, but the responsivity decreases.

The change of Schottky barrier height under strain is a combined effect from both strain induced band structure change (e.g., piezoresistance) and piezoelectric polarization. The contributions from band structure effect to SBH in source and drain contacts are denoted as $\Delta\phi_{d-bs}$ and $\Delta\phi_{s-bs}$, respectively. Assuming the axial strain is uniform in the ZnO wire along its entire length, $\Delta\phi_{d-bs} = \Delta\phi_{s-bs}$ if the two contacts are identical. This is the piezoresistance effect, which is symmetric and has equal effects regardless the polarity of the voltage. The asymmetric change of I-V curve at negative and positive bias in our case is dominated by piezoelectric effect rather than piezoresistance effect. The effect of piezopotential to the SBH can be qualitatively described as follows. For a constant strain of $\varepsilon_{xx}$ along the length of the wire, an axial polarization $P_x = \varepsilon_{xx} e_{33}$ occurs, where $e_{33}$ is the piezoelectric tensor. A potential drop of approximately $V_p^+ - V_p^- = \varepsilon_{xx} L e_{33}$ is along the length of the wire, where L is the length of the wire. Therefore, the modulations to the SBH at the source and drain sides are of the same magnitude but opposite sign ($V_p^+ = -V_p^-$), which are denoted by $\Delta\phi_{d-pz}$ and $\Delta\phi_{s-pz}$ ($\Delta\phi_{d-pz} = -\Delta\phi_{s-pz}$).

In the experiments, the light intensity were fixed and the substrate was bent step-by-step, thus strain was introduced into the device step-by-step. Depending on the deformation direction, the sign of the strain was changed from positive to negative or vice versa. Meanwhile, the corresponding piezopotential distribution in the wire was also adjusted step-by-step, which changed the effective heights of the two Schottky barriers and thus the photocurrent and responsivity of the device. If the nanowire is positioned along c-axis direction from drain to source side, a positive potential drop will be induced along the length of the wire under compressive strain. Therefore the SBH at the drain contacts were decreased with increasing compressive strain, simultaneously the photocurrent and responsivity were increased under compressive strain.

The effect of piezopotential decreases with increasing light intensity, which may be caused by the screening effect of the newly generated charge carriers to the piezopotential. When ZnO wire is under high light intensity, large amount of free electrons and holes are generated. They will accumulate and make the piezoelectrical potential to be partially screened, and $\Delta\phi_{d-pz}$ will be decreased to $\Delta\phi_{d-pz-sc}$.

It is interesting that the piezoelectric effect on I-V curve in the dark is not obviously either. In the dark, the surface of the ZnO wire is depleted by absorbed oxygen molecules and the dark current is very low (about 14 pA at $-5$ V applied bias). In this case, the device can be considered as an insulator wire sandwiched between two back-to-back Schottky diodes, and the current is controlled by the bulk of the sample not by the Schottky contact. Thus although piezopotential tunes the SBH, it can't have dominant effect on the dark current. Therefore, piezopotential dramatically increases the responsivity for pW level light detection while keep low dark current characteristics of the devices, which is very useful for applications.

The inventors have demonstrated a piezopotential tuned low dark-current ultra-sensitive ZnO wire photodetector. The device remains low dark current characteristics while increasing the responsivity dramatically for pW level light detection by piezopotential. The derived change of barrier height with strain depends on excitation light intensity, the SBH changes faster at low light intensity than that at high light intensity. The physical mechanism is explained by considering both piezopotential effect and photon generated free charges screening effect. Three-way coupling of semiconducting, photonic and piezoelectric properties of semiconductor nanowires will allow tuning and controlling of electro-optical process by strain induced piezopotential, e.g., piezo-phototronic effect, and it will also lead to further integration between piezoelectric devices with microelectronic and optomechanical systems. Using the methods disclosed above, a device that uses light to tune the strain response can be used by measuring current flowing through it under an applied bias voltage.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A device for detecting light of an intensity, comprising:
   a. a substrate having a first surface;
   b. a piezoelectric nanowire disposed on the first surface of the substrate, the piezoelectric nanowire having a first end and an opposite second end, the piezoelectric nanowire subjected to a predetermined amount of strain that causes the piezoelectric nanowire to allow current to flow therethrough when the light is applied to a first location on the piezoelectric nanowire;
   c. a first Schottky contact in electrical communication with the first end of the piezoelectric nanowire;

d. a second Schottky contact in electrical communication with the second end of the piezoelectric nanowire;
e. a bias voltage source configured to impart a bias voltage between the first Schottky contact and the second Schottky contact; and
f. a mechanism configured to measure current flowing through the piezoelectric nanowire, so that the current flowing though the piezoelectric nanowire corresponds to the intensity of light.

2. The device of claim 1, wherein the substrate comprises a polymer.

3. The device of claim 2, wherein the polymer comprises polystyrene.

4. The device of claim 1, wherein the nanowire comprises a zinc oxide nanowire.

5. The device of claim 1, wherein the amount of strain is in a range of 2% tensile strain to −2% compressive strain.

6. The device of claim 1, wherein the substrate has a thickness, wherein the piezoelectric nanowire has a diameter and wherein the thickness of the substrate is substantially greater than the diameter of the nanowire.

* * * * *